(12) United States Patent
Shibata

(10) Patent No.: US 8,637,976 B2
(45) Date of Patent: Jan. 28, 2014

(54) SEMICONDUCTOR DEVICE WITH LEAD TERMINALS HAVING PORTIONS THEREOF EXTENDING OBLIQUELY

(71) Applicant: Rohm Co., Ltd., Kyoto (JP)

(72) Inventor: Kazutaka Shibata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 13/832,377

(22) Filed: Mar. 15, 2013

(65) Prior Publication Data

US 2013/0207251 A1 Aug. 15, 2013

Related U.S. Application Data

(60) Continuation of application No. 13/223,364, filed on Sep. 1, 2011, now Pat. No. 8,421,209, which is a continuation of application No. 12/659,733, filed on Mar. 19, 2010, now Pat. No. 8,026,591, which is a continuation of application No. 10/795,247, filed on Mar. 9, 2004, now Pat. No. 7,705,444, which is a division of application No. 09/970,056, filed on Oct. 4, 2001, now Pat. No. 6,710,431.

(30) Foreign Application Priority Data

Oct. 6, 2000 (JP) ................................. 2000-307377

(51) Int. Cl.
  *H01L 23/495* (2006.01)
  *H01L 23/28* (2006.01)
  *H01L 23/48* (2006.01)
  *H01L 23/31* (2006.01)

(52) U.S. Cl.
  USPC ............ 257/692; 257/E23.043; 257/E23.046; 257/E23.124; 257/690; 257/666; 257/775; 257/776; 257/676; 257/670; 257/671; 257/684; 257/667

(58) Field of Classification Search
  USPC ........... 257/692, E23.043, E23.046, E23.124, 257/690, 666, 775, 776, 676, 670, 671, 684, 257/667
  See application file for complete search history.

(56) References Cited

U.S. PATENT DOCUMENTS

| | | | |
|---|---|---|---|
| 4,477,827 A | 10/1984 | Walker et al. | |
| 4,862,246 A | 8/1989 | Masuda et al. | |
| 5,309,316 A | 5/1994 | Yagi et al. | |
| 5,378,656 A | 1/1995 | Kajihara et al. | |
| 5,637,913 A | 6/1997 | Kajihara et al. | |
| 5,654,585 A | 8/1997 | Nishikawa | |

(Continued)

FOREIGN PATENT DOCUMENTS

| | | |
|---|---|---|
| JP | 359100558 | 6/1984 |
| JP | 63-081966 A | 4/1988 |

(Continued)

*Primary Examiner* — A O Williams
(74) *Attorney, Agent, or Firm* — Rabin & Berdo, P.C.

(57) ABSTRACT

A semiconductor device in which a semiconductor chip, a lead frame and metal wires for electrically connecting the lead frame are sealed with sealing resin. The lead frame has a plurality of lead terminal portions, a supporting portion for supporting the semiconductor chip, and hanging lead portions supporting the supporting portion. Each of the lead terminal portions adjacent to the hanging lead portion is a chamfered lead terminal portion having, at its head, a chamfered portion formed substantially in parallel with the hanging lead portion so as to avoid interference with the hanging lead portion.

31 Claims, 4 Drawing Sheets

(56) References Cited

U.S. PATENT DOCUMENTS

| | | |
|---|---|---|
| 5,898,216 A | 4/1999 | Steffen |
| 6,008,528 A | 12/1999 | Go et al. |
| 6,075,282 A | 6/2000 | Champagne |
| 6,376,901 B1 | 4/2002 | Abbott |
| 6,696,749 B1 | 2/2004 | Hung et al. |
| 7,705,444 B2 * | 4/2010 | Shibata .................. 257/692 |
| 8,026,591 B2 * | 9/2011 | Shibata .................. 257/692 |
| RE43,443 E | 6/2012 | Kajihara et al. |
| 2004/0232442 A1 | 11/2004 | Shimanuki |

FOREIGN PATENT DOCUMENTS

| | | |
|---|---|---|
| JP | 402112267 | 4/1990 |
| JP | 3-69248 U | 7/1991 |
| JP | 07-030036 A | 1/1995 |
| JP | 07058267 A | 3/1995 |
| JP | 07-235630 | 9/1995 |
| JP | 07-235630 A | 9/1995 |
| JP | 11-224928 | 8/1999 |
| JP | 11-260983 A | 9/1999 |
| JP | 2002-110879 A | 4/2002 |

* cited by examiner

PRIOR ART FIG. 5
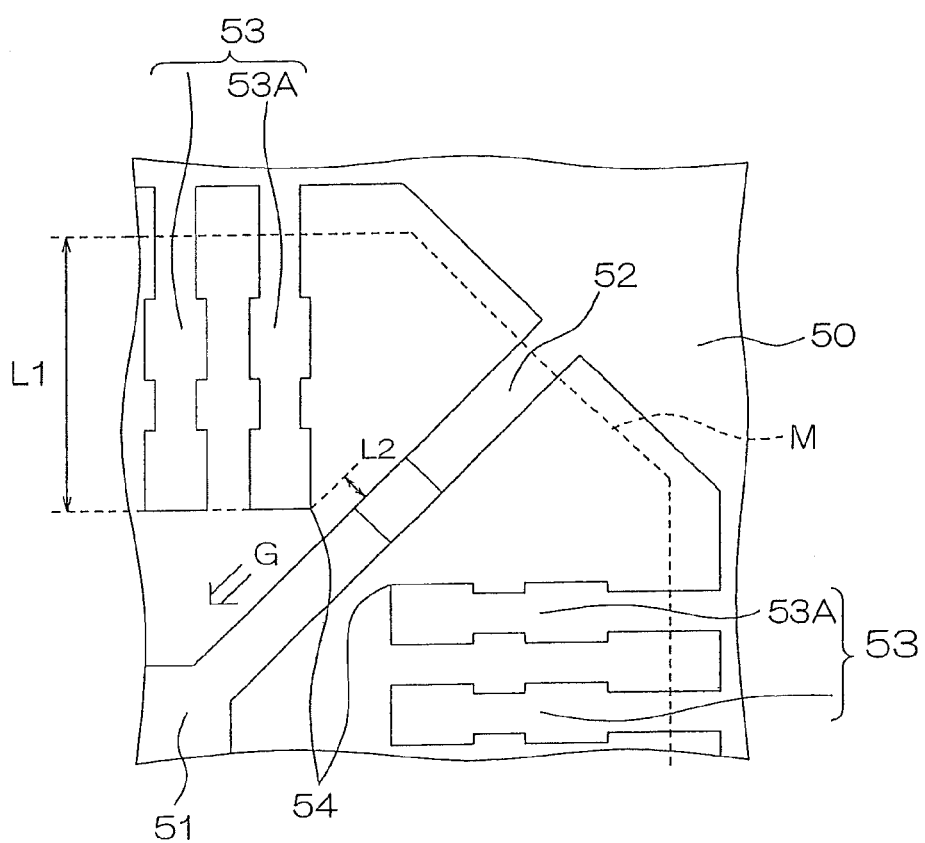

SEMICONDUCTOR DEVICE WITH LEAD TERMINALS HAVING PORTIONS THEREOF EXTENDING OBLIQUELY

CROSS-REFERENCE TO RELATED APPLICATIONS

This application is a continuation of application Ser. No. 13/223,364, filed Sep. 1, 2011, which is a continuation of application Ser. No. 12/659,733, filed on Mar. 19, 2010 (now U.S. Pat. No. 8,026,591, issued on Sep. 27, 2011), which is a continuation of application Ser. No. 10/795,247, filed on Mar. 9, 2004 (now U.S. Pat. No. 7,705,444, issued on Apr. 27, 2010), which is a divisional of application Ser. No. 09/970,056, filed on Oct. 4, 2001 (now U.S. Pat. No. 6,710,431, issued Mar. 23, 2004). Furthermore, this application claims the benefit of priority of Japanese application 2000-307377, filed Oct. 6, 2000. The disclosures of these prior U.S. and Japanese applications are incorporated herein by reference.

BACKGROUND OF THE INVENTION

1. Field of the Invention

The present invention relates to a resin-sealed type semiconductor device, and especially to a one-side resin-sealed type semiconductor device in which a surface of a lead frame on which a semiconductor element is mounted is sealed with a resin and a lead frame used therefor.

2. Description of Related Art

Resin-sealed type semiconductor devices each provided with a lead frame for electrically connecting electrodes of the semiconductor to an outer wiring and the like are widely used. In such a semiconductor device, a lead frame generally comprises a supporting portion for mounting a semiconductor element thereon, hanging lead portions for supporting the supporting portion, and lead terminal portions for connecting metal wires thereto. A lead frame used in the process of fabricating semiconductors includes a plurality of unit regions corresponding to a plurality of semiconductor devices so that the plurality of semiconductor devices can be fabricated at the same time. One unit region has a substantially rectangular shape. Each of the hanging lead portions extends inwardly from a corner portion of this rectangle, and in many cases, the lead terminal portions extend inwardly from side parts of the unit region.

FIG. 5 is an enlarged schematic pan view showing a part in the vicinity of a corner of a unit region.

In the central part of the substantially rectangular unit region (in the direction of arrow G), a supporting portion 51 is disposed. A hanging lead portion 52 extends from the supporting portion 51 toward the corner portion. In the side parts of the unit region, substantially rectangular lead terminal portions 53 are provided. Base end portions of the lead terminal portions 53 are connected to a peripheral frame part 50. The longitudinal direction of the hanging lead portion 52 and the longitudinal direction of the lead terminal portion 53 makes an angle of substantially 45°.

In a lead frame, a plurality of unit regions each having such a structure are arranged and connected to the frame part 50. In the process of fabricating semiconductor devices, a lead frame is sealed with a sealing resin in such a manner that the bottom surface of the lead terminal portion 53 is exposed. Thereafter, each unit of lead frame is cut along a cutting line M shown in broken line, and the cut end face is substantially in the same plane with the side surface of the sealing resin.

In order to obtain a small-sized semiconductor device, it is preferable that the length of the lead terminal portion 53 is as short as possible. However, since the lead terminal portion 53 functions as a lead for connection with outer wiring substrate, the lead terminal portion 53 needs to have a length (area) more than a predetermined length (area). From these reasons, the lead terminal portion 53 is formed to have a predetermined necessary minimum length L1.

The minimum distance between the hanging lead portion 53 and the lead terminal portion 53A adjacent to the hanging lead portion 53 must be large enough to ensure insulating reliability between them. However, in order to obtain a small-sized semiconductor device, it is preferable that the minimum distance between them is small. From these reasons, the minimum distance between them is designed to be a predetermined necessary minimum distance L2.

However, since the predetermined length L1 and the predetermine distance L2 are required to be secured, miniaturization of mounting area of a semiconductor device is limited.

SUMMARY OF THE INVENTION

An object of the present invention is to provide a semiconductor device in which each lead terminal portion has a length (area) necessary for outer connection and at has a length (area) necessary for outer connection and at the same time insulating reliability between the hanging lead portions and lead terminal portions is secured, and a lead frame used for the semiconductor device.

Another object of the present invention is to provide a semiconductor device having a small mounting area, and a lead frame used for the semiconductor device.

A semiconductor device according to the present invention comprises a semiconductor chip having electrodes on the surface thereof, a lead frame having a plurality of lead terminal portions for electric connection and a plurality of hanging lead portions each extending obliquely with respect to the lead terminal portions and supporting a supporting portion on which the semiconductor chip is mounted, metal wires for connecting the lead terminal portions and the electrodes of the semiconductor device, and a sealing resin for sealing the semiconductor element, the lead frame and the metal wires in such a manner that a part of each lead terminal portion is exposed. The plurality of lead terminal portions include chamfered lead terminal portions each having, at its head, a chamfered portion formed substantially in parallel with the hanging lead portion so as to avoid interference with the hanging lead portion.

Further, a lead frame according to the present invention comprises a plurality of lead terminal portions for electric connection and a plurality of hanging lead portions each extending obliquely with respect to the lead terminal portions and supporting a supporting portion on which the semiconductor chip is mounted. The plurality of lead terminal portions include chamfered lead terminal portions each having, at its head, a chamfered portion formed substantially in parallel with the hanging lead portion so as to avoid interference with the hanging lead portion.

According to this invention, the lead terminal portions are chamfered substantially in parallel with the hanging lead portion so as to avoid interference with the hanging lead portions. Accordingly, even if the chamfered lead terminal portion is disposed nearer to the hanging lead portion in comparison with the case of the conventional lead terminal portion, a distance more than a predetermined distance can still be secured between the lead terminal portion and the hanging lead portion.

That is, in a conventional lead frame, a lead terminal portion has a corner portion protruding toward a hanging lead portion. Therefore, it has been necessary to dispose the lead terminal portion substantially on the peripheral part side in order to avoid interference between an edge of the corner portion and the hanging lead portion and secure a distance more than a predetermined value therebetween. As a result, a unit region in a lead frame corresponding to a semiconductor becomes large, and the size in the plane direction of a semiconductor device using this unit region becomes large.

On the contrary, according to the present invention, the lead terminal portion has a chamfered portion at its head and is opposed to the hanging lead portion at this chamfered portion. Therefore, the hanging lead portion can be disposed at a more inner portion in comparison with the case of the conventional structure. Accordingly, a unit region of lead frame can be small-sized. As a result, the size in the plane direction of a semiconductor device can be reduced and the mounting area of the same can be also reduced.

The chamfered portion is preferably comprises a linear side in parallel with the lateral side of the hanging lead portion. However, other shapes are similarly effective as long as the portion is chamfered so as to avoid interference by the hanging lead portion. For example, the chamfered portion may comprise a curved side. Further, in the chamfered portion, the oblique side may extend through only a part or the whole width of the lead terminal portion.

It is preferable that the abovementioned chamfered lead terminal portion is disposed adjacent to the hanging lead portion.

Not only the lead terminal portion adjacent to the hanging lead portion but also another lead terminal portion adjacent to this chamfered lead terminal portion maybe a chamfered lead terminal portion. However, in this case, the chamfered lead terminal portion adjacent to the hanging lead portion becomes shorter than the other chamfered lead terminal portions. Therefore, it is preferable that only lead terminal portions adjacent to the hanging lead portion have such a chamfered portion. In this case, there is no remarkably short lead terminal portion. Therefore, in a semiconductor device using such a lead frame, all the lead terminal portions can be suitably connected to metal wires and an outer wiring substrate.

When only each lead terminal portion adjacent to the hanging lead portion comprises a chamfered lead terminal portion, the chamfered portion preferably has an oblique side extending throughout the whole width of the lead terminal portion. Thereby a unit region of lead frame can be minimized and the size of a semiconductor device using the same can be minimized in plan view. The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is an enlarged schematic plan view showing a part in the vicinity of a corner of a conventional lead frame.

DESCRIPTION OF THE PREFERRED EMBODIMENTS

Figure 1:
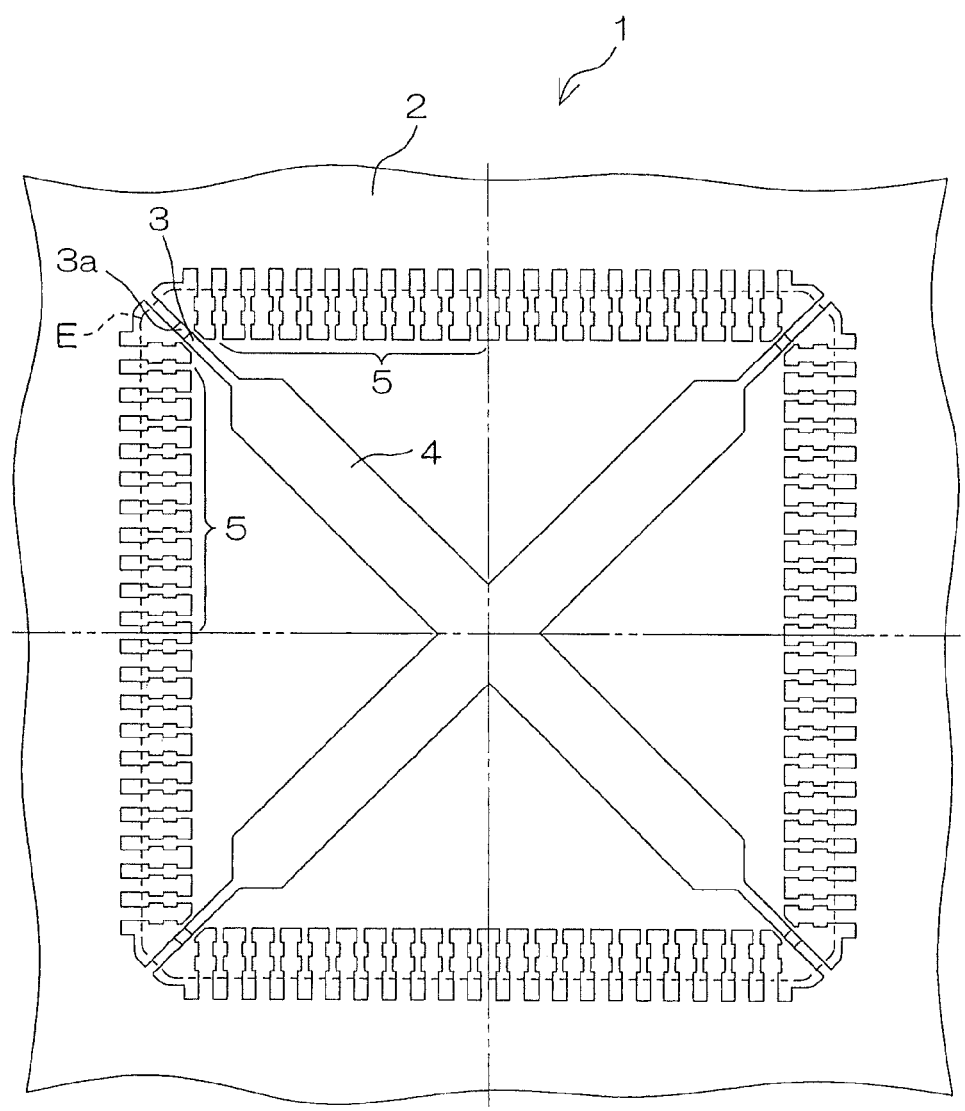
FIG. 1 is a schematic plan view showing a unit region of lead frame according to an embodiment of the present invention.

FIG. 1 is a schematic plan view showing a unit region (a repetition unit corresponding to a semiconductor device) of a lead frame 1 according to an embodiment of the present invention. The unit region of the lead frame 1 is, for example, substantially in the shape of a square and substantially symmetrical in the vertical and horizontal directions in FIG. 1. Therefore, reference numerals are given to only the upper left quarter part of the unit region in FIG. 1, but each of the remaining quarter parts has the same shape. The unit region comprises a frame portion 2 disposed in the peripheral part, a supporting portion 4 in the central part, a hanging lead portion 3 connecting the supporting portion 4 and an inner corner portion of the frame portion 2, and lead terminal portion 5 disposed on the inner side of the frame portion 2, and extending in parallel in the vertical and horizontal directions on the horizontal and verticals sides, respectively. The frame portion 2 is usually provided with holes (notshown) for positioning, fixing and the like the lead frame 1 in the fabricating process of a semiconductor device.

The supporting portion 4 extends diagonally from the inner corner of the frame portion 2 through the hanging lead portion 3. In other words, the whole of the supporting portion 4 is X-shaped. The supporting portion 4 is larger in width than the hanging lead portion 3. A step 3a is provided in the way of the hanging lead portion 3, and the supporting portion 4 is upset in a higher position than that of the frame portion 2.

The lead terminal portions 5 extend from the inner sides of the frame portion 2 toward the center thereof and vertically with respect to the inner sides. The hanging lead portion 3 is oblique with respect to the longitudinal direction of the lead terminal portions 5 with an angle of about 45° in plan view. Each of the lead terminal portions 5 has the same length.

A plurality of such unit regions each having the abovementioned structure are disposed in close to one another and constitute a lead frame.

In the process of fabricating a semiconductor device, a semiconductor chip is die-bonded on the supporting portion 4, and electrodes of the semiconductor chip and the lead terminal portions 5 are connected to each other by metal wires. Thereafter, the semiconductor chip, the supporting portion 4, a part of the hanging lead portion 3 and a part of the lead terminal portions 5 are covered with a sealing resin and the lead terminal portions 5 and the hanging lead portions 3 are cut at the position of a cutting line E shown in a broken line. The region covered with the sealing resin is a region enclosed by the cutting line E.

Figure 2:
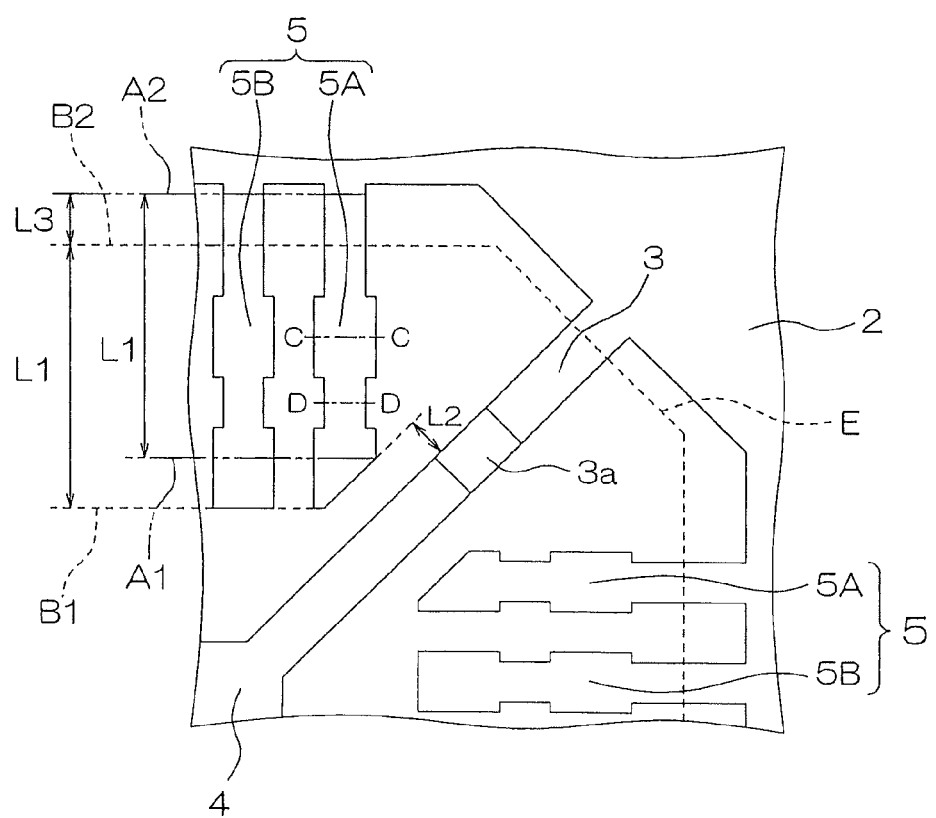
FIG. 2 is an enlarged schematic plan view showing a part in the vicinity of a corner of the unit region of lead frame shown in FIG. 1.

FIG. 2 is an enlarged schematic plan view showing a corner part of a unit region of lead frame shown in FIG. 1.

Among the plurality of lead terminal portions 5, each lead terminal portion 5B not adjacent to the hanging lead portion 3 has a head side formed perpendicular to the length thereof. On the other hand, each lead terminal lead 5A adjacent to the hanging lead portion 3 has an oblique head side substantially in parallel with and opposed to the side of the hanging lead portion 3 through the whole width of the lead terminal portion 5A. In other words, the lead terminal portion 5A is a chamfered lead terminal portion having, at its head end, a chamfered portion formed substantially in parallel with the hanging lead portion 3 so as to avoid interference with the hanging lead portion 3.

Step portions are provided at the sides of each lead terminal portion 5. That is, the lead terminal portion 5 has two wide portions and two narrow portions alternately disposed at shifted positions in the longitudinal direction thereof. As can be seen in FIG. 2 with respect to the adjacent lead terminal portions 5A and 5B, and is also apparent in FIG. 1 with respect to all adjacent terminal portions 5, the wide and narrow portions of each adjacent pair of lead terminal portions (such as the adjacent wide portions at the head ends of the lead terminal portions 5A and 5B) have respective opposing (adjacent) sides which are parallel to each other. The two wide portions and one narrow portion are wholly sealed within the sealing resin, and the remaining narrow portion is partly sealed with the sealing resin. With such a shape, the lead terminal portion 5 is hard to be pulled out toward the peripheral side.

Figure 3A:
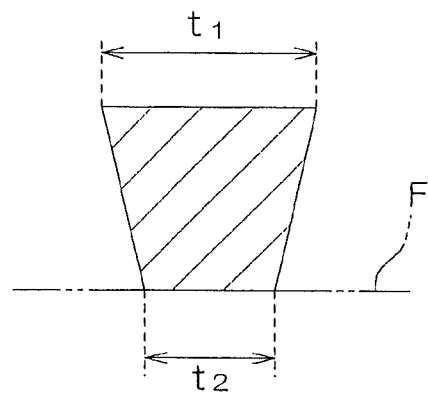
FIG. 3A is a sectional view along a cutting line C-C in FIG. 2.
Figure 3B:
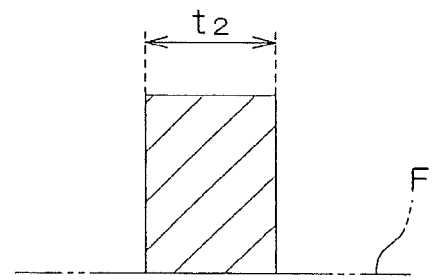
FIG. 3B is a sectional view along a cutting line D-D in FIG. 2.

FIG. 3A is a sectional view along the cutting line C-C of FIG. 2 and FIG. 3B is a sectional view along the cutting line D-D of FIG. 2.

The section along the cutting line C-C is a section of the wide portion of the lead terminal portion 5, and is in the shape of an inverted trapezoid the upper side of which has a length t1 and the lower side of which has a length t 2 (t1>t2) (FIG. 3A).

The section along the cutting line D-D is a section of the narrow portion of the lead terminal portion 5, and is in the shape of a rectangle having a width t2 (FIG. 3B). That is, the upper surface of the lead terminal portion 5 has different two widths t1 and t 2 shifted in the longitudinal direction, but the bottom surface thereof has the fixed width t2.

After sealing the lead frame 1 with a sealing resin, the sealing resin is filled to the position F in the same plane with the bottom surface of the lead terminal portion 5, and the bottom surface of the lead terminal portion 5 is exposed from the sealing resin to form a terminal portion for outer connection (an outer lead portion). At the wide portion having an inverted trapezoidal section (FIG. 3A), the lead terminal portion 5 is wider in the sealing resin and has tapered surfaces opposed to the bottom surface side of the sealing resin. With this structure, the lead terminal portion 5 is hard to be pulled out downwardly from the sealing resin.

Further description will be given with reference to FIG. 2 again.

Since the lead terminal portion 5 functions as a lead for connection with outer wiring substrate, the exposed area of the lead terminal portion 5 from the sealing resin must be lager than a predetermined area. Therefore, it is necessary to secure more than a predetermined length of the lead terminal portion 5 after being cut. On the other hand, in order to obtain a small-sized semiconductor device, it is preferable that the length of the lead terminal portion 5 is as short as possible. From these reasons, the lead terminal portion 5 is formed to have a predetermined necessary minimum length L1.

The minimum distance between the hanging lead portion 3 and the lead terminal portion 5A adjacent to the hanging lead portion 3 must be large enough to ensure insulating reliability between them. However, in order to obtain a small-sized semiconductor device, it is preferable that the minimum distance between them is small. From these reasons, the minimum distance between them is designed to be a predetermined necessary minimum distance L2.

When, using a lead terminal portion 53 having a conventional shape shown in FIG. 5, the length of the lead terminal portion 53 is set to be the predetermined length L1 and the minimum distance between the hanging lead portion 52 and the adjacent lead terminal portion 53 is set to be the predetermined distance L2, the lead terminal portion 53 must be disposed further on the peripheral portion side in comparison with the case of this embodiment. The reason is that, since a corner portion 54 of a conventional lead terminal portion 53 at the most adjacent position to the hanging lead portion 52 protrudes toward the hanging lead portion 52, the minimum distance becomes smaller than the predetermined distance L2 when the head end position A1 is aligned with the head end position B1 of this embodiment. Therefore, the head end position B1 of the lead terminal portion 5 of this embodiment can be set at a more inner position by a distance L3 in comparison with the head end position A1 of the conventional lead terminal portion 53. Since the lengths of the lead terminal portions 5, 53 are the predetermined length L1 respectively, the rear end position B2 of the lead terminal portion 5 of this embodiment is at a more inner position in comparison with the rear end position A2 of the conventional lead terminal portion 53. As a result, a unit region of such a lead frame 1 according to the present invention can be small-sized.

Further, since the sealing resin is formed substantially in the same plane with the rear endpositions A2, B2, a semiconductor device using a lead frame 1 of this embodiment can be more small-sized by 2×L3 per one side. Therefore, the packaging area of the semiconductor device can be smaller.

It is also noted that as can be seen in FIG. 2 (as well as in FIG. 1), the respective head sides of the successively adjacent lead terminal portions 5 confronting the semiconductor chip are aligned along a straight line (for example, line B1 in FIG. 2).

Figure 4:
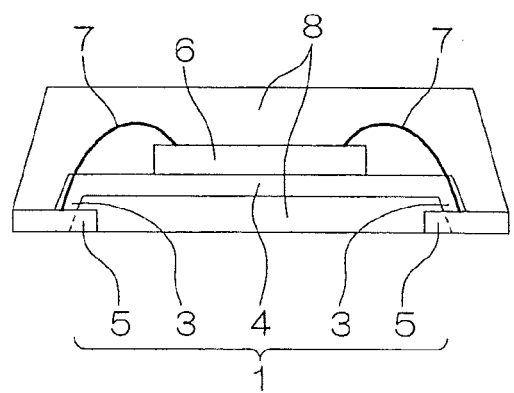
FIG. 4 is a schematic sectional view of a resin-sealed type semiconductor device fabricated using the lead frame shown in FIG. 1.

FIG. 4 is a schematic sectional view of a semiconductor device fabricated using such a lead frame 1. Each part of the lead frame 1 is given with the same reference numeral as shown in FIG. 1 and the description thereof is omitted.

A semiconductor chip 6 is die-bonded on a supporting portion 4. The supporting portion 4 is X-shaped (see FIG. 1). The area of the upper surface of the supporting portion 4 is smaller than that of the bottom surface of the semiconductor chip 6.

Electrodes formed on the upper surface of the semiconductor chip 6 and the lead terminal portions 5 are electrically connected to each other by metal wires 7. The semiconductor chip 6, metal wires 7 and a part of the lead frame 1 are covered with a sealing resin 8. At the bottom surface of the semiconductor device, the lead terminal portions 5 and the sealing resin 8 are formed in the same plane, and the bottom surface of each lead terminal portion 5 is exposed. The sealing resin 8 is present below the supporting portion 4 by a thickness corresponding to the height of the upsetting. Further, the end face of the lead terminal portion 5 is substantially in the same plane with the side surface of the sealing resin 8.

A semiconductor device having such a structure can be surface-mounted, for example, on a wiring substrate with the lead terminal portions 5 exposed at the bottom surface functioning as outer terminals. Further, since only one surface side of the lead terminal portion 5 is sealed by the sealing resin 8, the thickness of the semiconductor device can be made smaller. Therefore, such a semiconductor device can be suitably mounted on each kind of thin type apparatus.

The sealing resin 8 is present below the supporting portion 4, and therefore, the supporting portion 4 and the hanging lead porting 3 are firmly connected with the sealing resin 8. Since the area of the supporting portion 4 is smaller than that of the bottom surface of the semiconductor chip 6, parts of the bottom surface of the semiconductor chip 6 are in direct contact with the sealing resin 8. As a result, exfoliating phenomenon occurring at the boundary surface between the supporting portion 4 and the semiconductor element 6 can be reduced.

Though one embodiment of the present invention has been described above, the present invention can be embodied in other forms. For example, in the abovementioned embodiment, a lead terminal portion 5 having the wide portions and the narrow portions, but the lead terminal portion 5 may have the same width throughout the length thereof. Further, the wide portion of the lead terminal portion 5 has a section in the shape of an inverted trapezoid in the abovementioned embodiment, but the wide portion may have a rectangular section. Further, the narrow portion of the lead terminal portion 5 may have a section in the shape of an inverted trapezoid, and the lead terminal portion 5 may have the same section in the shape of an inverted trapezoid throughout the length thereof.

Further, in the abovementioned embodiment, the head end face of the lead terminal portion 5 is in the same plane with the side surface of the sealing resin 8, but the head end face of the lead terminal portion 5 may covered with the sealing resin 8. Furthermore, the lead terminal portion 5 may be cut at a position protruding from the sealing resin 8. In this case, since the lead terminal portion 5 can be mounted on a wiring substrate or the like at a position protruding from the sealing resin 8, the lower surface of the lead terminal portion 5 need to be exposed from the sealing resin 8.

Further, though the supporting portion 4 on which a semiconductor chip 6 is die-bonded is X-shaped in the abovementioned embodiment, the supporting portion 4 may be in other shapes such as a rectangle.

Further, though the supporting portion 4 is upset in the abovementioned embodiment, the present invention can include such structures that the supporting portion 4 is in the same plane with the lead terminal portion 5 and that the supporting portion 4 is downset at a position lower than the lead terminal portion 5.

Although the embodiments of the present invention has been described and illustrated in detail, it is clearly understood that the same is by way of illustration and example only and is not to be taken by way of limitation, the spirit and scope of the present invention being limited only by the terms of the appended claims.

What is claim is:

1. A semiconductor device, comprising:
   a semiconductor chip having a plurality of electrodes on the surface thereof,
   a plurality of lead terminal portions for external connection, hanging lead portions coupled to a supporting portion on which the semiconductor chip is mounted,
   metal wires for respectively connecting the lead terminal portions and the electrodes of the semiconductor chip to each other, and
   a sealing resin for sealing the semiconductor chip and the metal wires in such a manner that a part of each lead terminal portion is exposed,
   wherein lead terminal portions among the plurality of the lead terminal portions, arranged adjacent to the hanging lead portions each have a chamfered portion at an end closer to the semiconductor chip, the chamfered portion is chamfered substantially along an adjacent one of the hanging lead portions, and a pair of the chamfered portions confront each other across the corresponding hanging lead portion, and
   wherein the plurality of lead terminal portions includes successively adjacent lead terminal portions each having a head side confronting the semiconductor chip, the head sides of the respective successively adjacent lead terminal portions being aligned along a straight line, and each of the head sides confronts a corresponding one of the head sides across the semiconductor chip.

2. The semiconductor device according to claim 1, wherein the chamfered lead terminal portions are each arranged to avoid interference with the adjacent one of the hanging lead portions.

3. The semiconductor device according to claim 1, wherein the chamfered portion extends substantially throughout a whole width of the lead terminal portion having the chamfered portion.

4. The semiconductor device according to claim 1, wherein an end face of the lead terminal portion is substantially in a same plane with a side surface of the sealing resin.

5. The semiconductor device according to claim 1, wherein a bottom surface of the lead terminal portion is exposed from a bottom surface of the sealing resin to form an outer lead portion.

6. The semiconductor device according to claim 1, wherein at least a part of a section of the lead terminal portion is in a shape of an inverted trapezoid.

7. The semiconductor device according to claim 1, wherein the chamfered portion includes a linear side that is parallel to a lateral side of the hanging lead portion and the linear side of the chamfered portion extends across substantially an entire width of the lead terminal portion having the chamfered portion.

8. The semiconductor device according to claim 1, wherein a side of the lead terminal portion includes a step.

9. The semiconductor device according to claim 1, wherein the hanging lead portions each have a step, whereby the supporting portion is offset from the lead terminal portions.

10. The semiconductor device according to claim 1, wherein the device has a cut-out corner portion.

11. The semiconductor device according to claim 10, wherein the cut-out corner portion has a side extending in a direction perpendicular to an adjacent one of the hanging lead portions.

12. The semiconductor device according to claim 10, wherein all corner portions of the device are the cut-out corner portions.

13. The semiconductor device according to claim 1, wherein the chamfered portion includes a curved side.

14. The semiconductor device according to claim 1, wherein the chamfered portion has an oblique side extending only in a part of the width of the chamfered lead terminal portion.

15. The semiconductor device according to claim 1, wherein the chamfered portion has an oblique side extending across substantially the entire width of the lead terminal portion having the chamfered portion.

16. The semiconductor device according to claim 1, wherein the device is substantially in a shape of a square and substantially symmetrical in two directions perpendicular to each other when viewed in plan.

17. The semiconductor device according to claim 1, wherein the hanging lead portions each extend diagonally from a corner of the device.

18. The semiconductor device according to claim 1, wherein the supporting portion is X-shaped.

19. The semiconductor device according to claim 1, wherein the supporting portion is larger in width than the hanging lead portion.

20. The semiconductor device according to claim 1, wherein the hanging lead portion is oblique with respect to a longitudinal direction of the lead terminal portions with an angle of approximately 45° in plan view.

21. The semiconductor device according to claim 1, wherein each of the lead terminal portions has a same length.

22. The semiconductor device according to claim 1, wherein each lead terminal portion not adjacent to the hanging lead portion has a head side formed perpendicular to a length thereof.

23. The semiconductor device according to claim 1, wherein the lead terminal portion has a tapered surface opposed to a bottom surface side of the sealing resin.

24. The semiconductor device according to claim 1, wherein the sealing resin is substantially in a same plane with a rear end of the lead terminal portion.

25. The semiconductor device according to claim 1, wherein an area of an upper surface of the supporting portion is smaller than an area of a bottom surface of the semiconductor chip.

26. The semiconductor device according to claim 1, wherein the sealing resin is present below the supporting portion by a thickness corresponding to a height of an upsetting of the supporting portion.

27. The semiconductor device according to claim 1, wherein a bottom of the semiconductor chip is in direct contact with the sealing resin.

28. The semiconductor device according to claim 1, wherein the hanging lead portion has a width different from a width of the supporting portion.

29. The semiconductor device according to claim 1, wherein at least a part of the lead terminal portion has a section having a lower side and an upper side longer than the lower side.

30. The semiconductor device according to claim 1, wherein bottom surfaces of the lead terminal portions and a bottom surface of the sealing resin are flush with each other.

31. The semiconductor device according to claim 1, wherein each of the lead terminal portions has a wide portion and a narrow portion.

* * * * *